United States Patent [19]

Tani

[11] Patent Number: 5,706,223
[45] Date of Patent: Jan. 6, 1998

[54] LOGIC SIMULATOR AND LOGIC SIMULATION METHOD

[75] Inventor: Takahiro Tani, Itami, Japan

[73] Assignees: Mitsubishi Denki Kabushiki Kaisha, Tokyo; Mitsubishi Electric Semiconductor Software Corporation, Itami, both of Japan

[21] Appl. No.: 271,736

[22] Filed: Jul. 7, 1994

[30] Foreign Application Priority Data

Jul. 13, 1993 [JP] Japan .................... 5-173459

[51] Int. Cl.[6] .................... G06G 7/48; G06F 15/00
[52] U.S. Cl. .................... 364/578; 364/488; 364/489; 364/490; 364/481; 395/183.01; 395/183.09; 395/184.01; 395/185.01; 371/3; 371/25.1; 371/35; 324/765
[58] Field of Search .................... 364/488, 489, 364/490, 491, 578, 468, 580; 371/61, 22.2, 22.3, 22.4, 22.1, 25.1, 27, 63, 22.6, 3, 24, 37.1, 57.1, 26, 6, 21.4; 395/180, 183.03, 185.08, 500, 183.09, 183.07; 379/121, 278, 384; 324/73.1, 754

[56] References Cited

U.S. PATENT DOCUMENTS

| | | | |
|---|---|---|---|
| 3,702,011 | 10/1972 | Armstrong | 364/578 |
| 3,780,277 | 12/1973 | Armstrong et al. | 371/26 |
| 3,882,386 | 5/1975 | Vinsani | 324/73.1 |
| 3,892,954 | 7/1975 | Neuner | 371/25.1 |
| 3,927,371 | 12/1975 | Pomeranz et al. | 371/25.1 |

(List continued on next page.)

OTHER PUBLICATIONS

Ruan et al "Fault Modeling for MOS Digital Circuit ..." pp. 681–683, 1988 IEEE Aug. 1988.

Wu et al "SEESIM—A Fast Synchronous Sequential Circuit Fault Simulator" pp. 446–449, 1992 IEEE Aug. 1992.

Ogihara et al "Test Generation for Sequential Circuits" pp. 424–427, 1988 IEEE May 1988.

Kitamura "Exact Critical Path Tracing Fault Simulation ..." pp. 474–477, 1989 IEEE Jan. 1989.

Verilog-XL Reference Manual, vol. 2, Mar. 1991, pp. 6–38 to 6–41, "Gate and Switch Level Modeling".

Primary Examiner—Jacques Louis-Jacques
Attorney, Agent, or Firm—Oblon, Spivak, McClelland, Maier & Neustadt, P.C.

[57] ABSTRACT

A logic simulation device includes an indefinite value generating signal line extracting unit, a propagation deciding unit and a message output unit. The logic simulation device is supplied with circuit connection data of a logic circuit and input signal data employed for simulating the logic circuit. The indefinite value generating signal line extracting unit extracts a signal line which enters a floating state in excess of an allowance time or that causes a collision of logic states as an indefinite value generating signal line. The propagation deciding unit decides whether or not a propagation candidate gate having a propagation input end which is connected with an indefinite value generating signal line is in a state propagating the indefinite value to its output. The propagation deciding unit decides that the indefinite value generating signal line is an error signal line causing an error only when the propagation candidate gate is in a state of propagating the value at the propagation input end. The message output unit outputs a warning message for indicating that the error signal line is a signal line to which the indefinite value generated by an operation of the circuit may be propagated to feed a through current.

16 Claims, 11 Drawing Sheets

U.S. PATENT DOCUMENTS

| | | | |
|---|---|---|---|
| 4,308,616 | 12/1981 | Timoc | 371/23 |
| 4,418,410 | 11/1983 | Goetze et al. | 371/22.2 |
| 4,601,032 | 7/1986 | Robinson | 371/23 |
| 4,668,880 | 5/1987 | Shoji | 364/488 |
| 4,715,035 | 12/1987 | Boehner | 371/25.1 |
| 4,761,607 | 8/1988 | Shiragasawa et al. | 371/22.1 |
| 4,769,817 | 9/1988 | Krohn et al. | 395/183.09 |
| 4,771,428 | 9/1988 | Acuff et al. | 371/25.1 |
| 4,852,093 | 7/1989 | Koeppe | 364/578 |
| 4,855,726 | 8/1989 | Nishio | 364/488 |
| 4,862,399 | 8/1989 | Freeman | 364/578 |
| 4,908,576 | 3/1990 | Jackson | 371/25.1 |
| 4,937,765 | 6/1990 | Shupe et al. | 371/25.1 |
| 4,937,826 | 6/1990 | Gheenala et al. | 371/22.1 |
| 4,961,156 | 10/1990 | Takasaki | 364/489 |
| 4,965,800 | 10/1990 | Farnbach | 371/22.1 |
| 5,051,911 | 9/1991 | Kimura et al. | 364/468 |
| 5,257,268 | 10/1993 | Agrawal et al. | 371/27 |
| 5,272,651 | 12/1993 | Bush et al. | 364/578 |
| 5,400,270 | 3/1995 | Fukui et al. | 364/578 |
| 5,404,360 | 4/1995 | Suzuki et al. | 371/61 |
| 5,422,891 | 6/1995 | Bushnell et al. | 364/578 |
| 5,426,770 | 6/1995 | Nuber | 395/500 |
| 5,446,748 | 8/1995 | Hasebe et al. | 371/61 |
| 5,513,339 | 4/1996 | Agrawal et al. | 395/500 |
| 5,541,861 | 7/1996 | Komoda et al. | 364/578 |

LOGIC SIMULATOR AND LOGIC SIMULATION METHOD

BACKGROUND OF THE INVENTION

1. Field of the Invention

The present invention relates to a technique of logic simulation for verifying circuit operation characteristics of a digital logic circuit.

2. Background of the Invention

Figure 1:
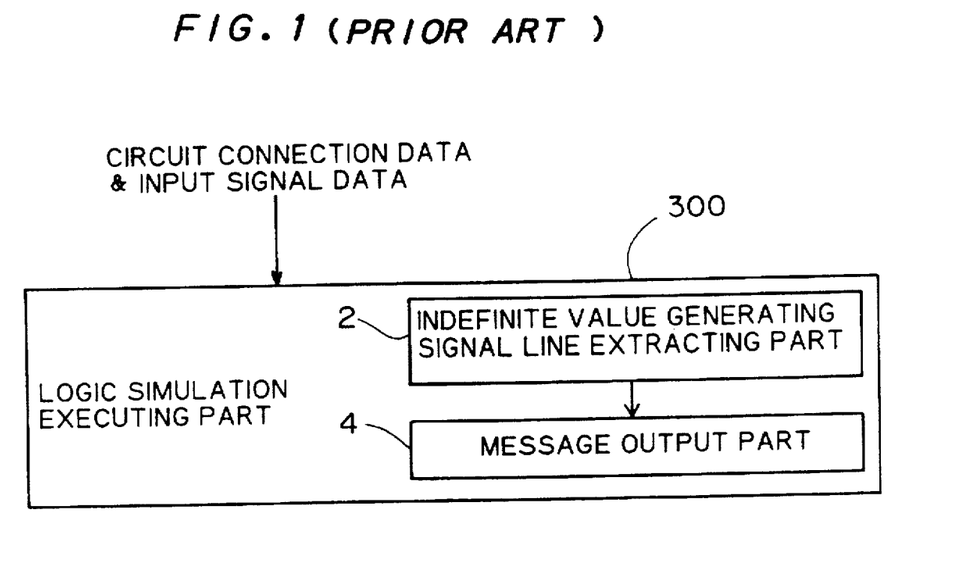
FIG. 1 is a block diagram showing a conventional system.

FIG. 1 is a block diagram showing a conventional logic simulation system. A logic simulation executing part 300 comprises an indefinite value generating signal line extracting part 2 and a message output part 4. The logic simulation executing part 300 is supplied with circuit connection data of a logic circuit to be simulated (hereinafter simply referred to as "logic circuit") and input signal data employed for simulating the logic circuit.

The indefinite value generating signal line extracting part 2 has a function of extracting a signal line (hereinafter referred to as "indefinite value generating signal line") generating an indefinite value state. A signal line provided in the logic circuit is decided as an indefinite value generating signal line when this signal line enters a floating state in excess of a constant period or causes a collision of logic states by an operation of the logic circuit.

When such an indefinite value generating signal line is extracted, the message output part 4 outputs a warning message indicating that there is a possibility of propagation of the indefinite value. This warning message is outputted since such propagation of the indefinite value leads to an undesirable flow of a through current in the logic circuit.

Figure 2:
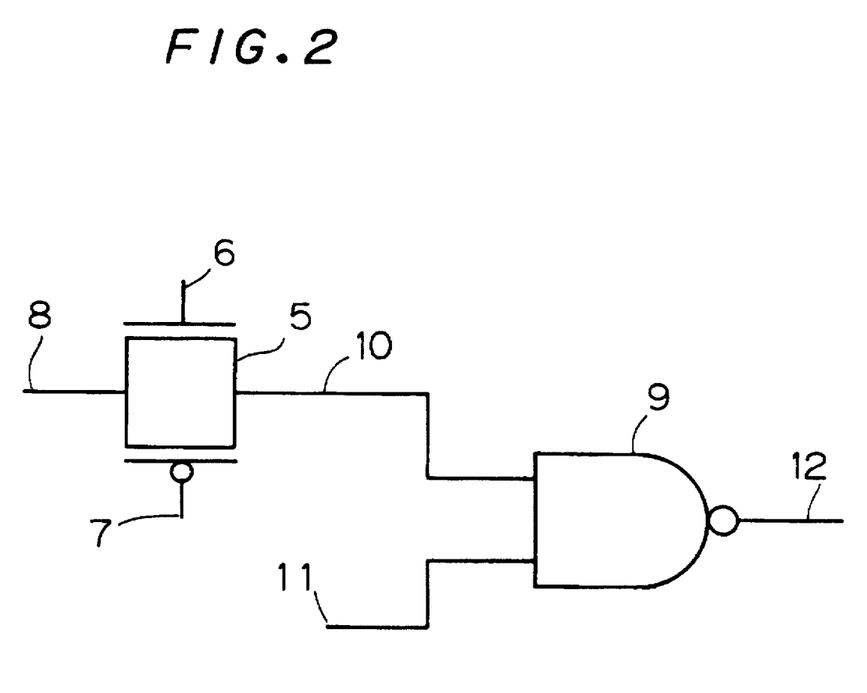
FIG. 2 is a circuit diagram showing a part of a logic circuit to be logically simulated.

This is now described in more concrete terms with reference to the logic circuit. FIG. 2 is a circuit diagram illustrating a part of the logic circuit, which has a transfer gate 5 and a two-input NAND gate 9. The transfer gate 5 is formed by a parallel connection of an NMOS transistor 6 and a PMOS transistor 7, so that a prescribed input is supplied to gates of the transistors 6 and 7 and a value which is supplied to a signal line 8 is propagated or not propagated to a signal line 10. The NAND gate 9 has an input end which is connected with the signal line 10, another input end which is connected with a signal line 11, and an output end which is connected with a signal line 12.

The operation is now described. The logic simulation executing part 300 is supplied with circuit connection data corresponding to the circuit diagram shown in FIG. 2, and input signal data to be inputted in the signal lines 8 and 11 and gate electrodes of the transistors 6 and 7 forming the transfer gate 5. On the basis of the input signal data, the logic simulation executing part 300 executes logic simulation on the circuit connection data. At this time, the indefinite value generating signal line extracting part 2 sequentially observes signal values on the signal lines provided in the logic circuit, to extract a signal line which is in a floating state in excess of a constant period by the circuit operation.

When the transfer gate 5 is turned off by the signal which is supplied to the gate electrodes of the transistors 6 and 7 in FIG. 2, for example, the signal line 10 is disconnected from the signal line 8 and enters a floating state. A constant allowance time is previously set so that the signal line 10 is decided as an indefinite value generating signal line when the floating state exceeds the allowance time.

In a signal line which is in a floating state in excess of a certain degree of period (allowance time), its potential may be instabilized due to leakage of electric charges to a substrate or the like in the logic circuit formed in practice. The aforementioned decision is made for this reason. A signal line (not shown in FIG. 2) causing a collision of logic states is also decided as an indefinite value generating signal line since its potential may be instabilized, as a matter of course.

The message output part 4 gives a warning about such a possibility that a through current flows to the NAND gate 9 due to propagation of the indefinite value provided on the signal line 10. In more concrete terms, the message output part 4 outputs a warning message to a CRT screen or an error list.

In the conventional logic simulation system having the aforementioned structure, an error message is indiscriminately outputted when a signal line enters a floating state in excess of a constant allowance time or causes a collision of logic states, to give a warning as to instabilization of the potential.

In practice, however, no through current flows when a gate (hereinafter referred to as "propagation candidate gate") which is connected with an indefinite value generating signal line does not propagate the indefinite value, i.e., when an output signal value of the propagation candidate gate is ascertained regardless of the indefinite value. In the conventional technique, however, an error message is inevitably outputted also in this case. Output of such an unnecessary error message disadvantageously leads to difficulty in analysis of a correct (true) error position and deterioration of reliability.

Such a problem is also caused when a signal line is supplied with a spike signal. When a gate having an input end which is connected with such a signal line propagates the spike signal to supply the same also to a next gate, an unnecessary current flows. Even though the flow of the unnecessary current is instantaneous, it causes unnecessary consumption of power, leading to a malfunction such as racing. However, such a malfunction is not caused in every gate which is connected with the signal line receiving the spike signal.

SUMMARY OF THE INVENTION

According to an aspect of the present invention, a logic simulator for carrying out logic simulation by receiving circuit connection data of a logic circuit to be logically simulated, having a plurality of logic elements, and input signal data corresponding to input signals which are supplied to the logic circuit comprises (a) error signal line candidate extracting means for extracting a signal line having an instable logic value as an error signal line candidate on the basis of the circuit connection data and the input signal data, (b) a logic element sort detecting part for detecting the sort of a propagation logic element, which is one of the logic elements, including a propagation input end connected with the error signal line candidate, (c) a processing part for deciding the error signal line candidate as an error signal line in accordance with a prescribed condition when the propagation logic element further includes an input end which is different from the propagation input end, and (d) an output part for displaying the error signal line.

Preferably, the error signal line candidate extracting means extracts a signal line maintaining a floating state in excess of a constant allowance time as the error signal line candidate.

Preferably, the error signal line candidate extracting means extracts a signal line generating a spike signal as the error signal line candidate.

Preferably, the processing part decides the error signal line candidate which is connected to the propagation input end as the error signal line when the propagation logic element is a NOT gate.

Preferably, the prescribed condition comprises the condition: (c-1) the error signal line candidate which is connected to the propagation input end is decided as the error signal line when the propagation logic element is either an EXOR gate or an EXNOR gate.

Preferably, the prescribed condition further comprises the following condition: (c-2) the error signal line candidate is not decided as the error signal line when the propagation logic element is either an AND gate or a NAND gate and the propagation logic element further includes an input end which is supplied with a logic "L" in addition to the propagation input end.

Preferably, the prescribed condition further comprises the following condition: (c-3) the error signal line candidate is not decided as the error signal line when the propagation logic element is either an OR gate or a NOR gate and the propagation logic element further includes an input end which is supplied with a logic "H" in addition to the propagation input end.

Preferably, the prescribed condition further comprises the following condition: (c-4) the error signal line candidate is not decided as the error signal line when the propagation logic element is a switch gate element including first and second electrodes and a control electrode so that the first and second electrodes are on-off controlled by a logic value which is supplied to the control electrode, and logic values of the first and second electrodes are equal to each other at such a point of time that the control electrode corresponds to the propagation input end.

Preferably, the prescribed condition further comprises the following condition: (c-5) the error signal line candidate is not decided as the error signal line when the propagation logic element is the switch gate element and a logic value for turning off the switch gate is inputted in the control electrode at such a point of time that the first electrode corresponds to the propagation input end.

The present invention is also directed to a logic simulation method. According to another aspect of the present invention, a logic simulation method for carrying out logic simulation by obtaining circuit connection data of a logic circuit to be logically simulated, having a plurality of logic elements, and input signal data corresponding to input signals which are supplied to the logic circuit comprises (a) a step of extracting a signal line having an instable logic value as an error signal line candidate on the basis of the circuit connection data and the input signal data, (b) a step of detecting the sort of a propagation logic element, which is one of the logic elements, including a propagation input end connected with the error signal line candidate, (c) a step of deciding the error signal line candidate as an error signal line in accordance with a prescribed condition when the propagation logic element further includes an input end which is different from the propagation input end, and (d) an step of displaying the error signal line.

Preferably, a signal line maintaining a floating state in excess of a constant allowance time is extracted as the error signal line candidate in the step (c).

Preferably, a signal line generating a spike signal is extracted as the error signal line candidate in the step (c).

Preferably, the error signal line candidate which is connected to the propagation input end is decided as the error signal line when the propagation logic element is a NOT gate in the step (c).

Preferably, the prescribed condition comprises the following condition: (c-1) the error signal line candidate which is connected to the propagation input end is decided as the error signal line when the propagation logic element is either an EXOR gate or an EXNOR gate.

Preferably, the prescribed condition further comprises the following condition: (c-2) the error signal line candidate is not decided as the error signal line when the propagation logic element is either an AND gate or a NAND gate and the propagation logic element further includes an input end which is supplied with a logic "L" in addition to the propagation input end.

Preferably, the prescribed condition further comprises the following condition: (c-3) the error signal line candidate is not decided as the error signal line when the propagation logic element is either an OR gate or a NOR gate and the propagation logic element further includes an input end which is supplied with a logic "H" in addition to the propagation input end.

Preferably, the prescribed condition further comprises the following condition: (c-4) the error signal line candidate is not decided as the error signal line when the propagation logic element is a switch gate element including first and second electrodes and a control electrode so that the first and second electrodes are on-off controlled by a logic value which is supplied to the control electrode, and logic values of the first and second electrodes are equal to each other at such a point of time that the control electrode corresponds to the propagation input end.

Preferably, the prescribed condition further comprises the following condition: (c-5) the error signal line candidate is not decided as the error signal line when the propagation logic element is the switch gate element and a logic value for turning off the switch gate is inputted in the control electrode at such a point of time that the first electrode corresponds to the propagation input end.

When a propagation candidate gate including a propagation input end which is connected with an error signal line candidate propagates neither an indefinite value nor a spike signal to its output end, the error signal line candidate is not decided as an error signal line according to the present invention.

According to the present invention, therefore, it is possible to provide a logic simulation technique which can avoid output of an unnecessary error message, thereby improving reliability in detection of a defective signal line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 3:
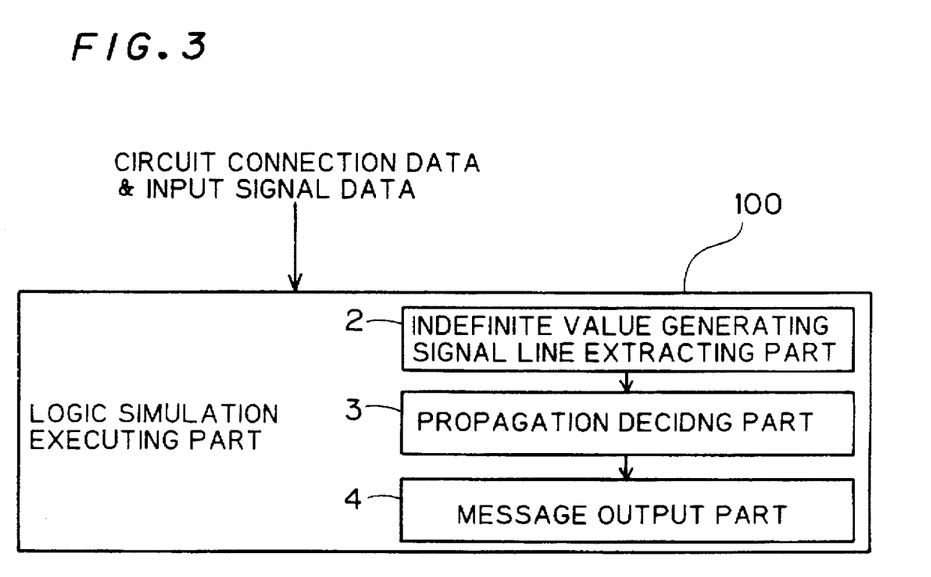
FIG. 3 is a block diagram showing an embodiment 1 according to the present invention.

FIG. 3 is a block diagram showing a logic simulation system according to an embodiment of the present invention. A logic simulation executing part 100 comprises an indefinite value generating signal line extracting part 2 and a message output part 4 similarly to the conventional logic simulation executing part 300, as well as a propagation deciding part 3. The logic simulation executing part 100 is supplied with circuit connection data of a logic circuit and input signal data employed for simulating the logic circuit, similarly to the conventional logic simulation executing part 300. The indefinite value generating signal line extracting part 2, which operates similarly to that of the prior art, extracts a signal line which enters a floating state in excess of a constant allowance time or that causing a collision of logic states as an indefinite value generating signal line.

The propagation deciding part 3 decides whether or not a propagation candidate gate having an input end (hereinafter referred to as "propagation input end") which is connected with an indefinite value generating signal line is in a state propagating the indefinite value to the output end of its own. The part 3 decides that the indefinite value generating signal line is an error signal line causing an error only when the propagation candidate gate is in a state of propagating the value at the propagation input end.

While the structure of the message output part 4 provided in the logic simulation executing part 100 according to this embodiment itself is similar to that of the prior art, this part 4 is supplied with information as to an error signal line dissimilarly to that in the conventional logic simulation executing part 300 which is supplied with information related to an indefinite value generating signal line. Thus, the message output part 4 outputs a warning message for indicating that the error signal line is a signal line to which the indefinite value generated by an operation of the circuit may be propagated to feed a through current.

Figure 4:
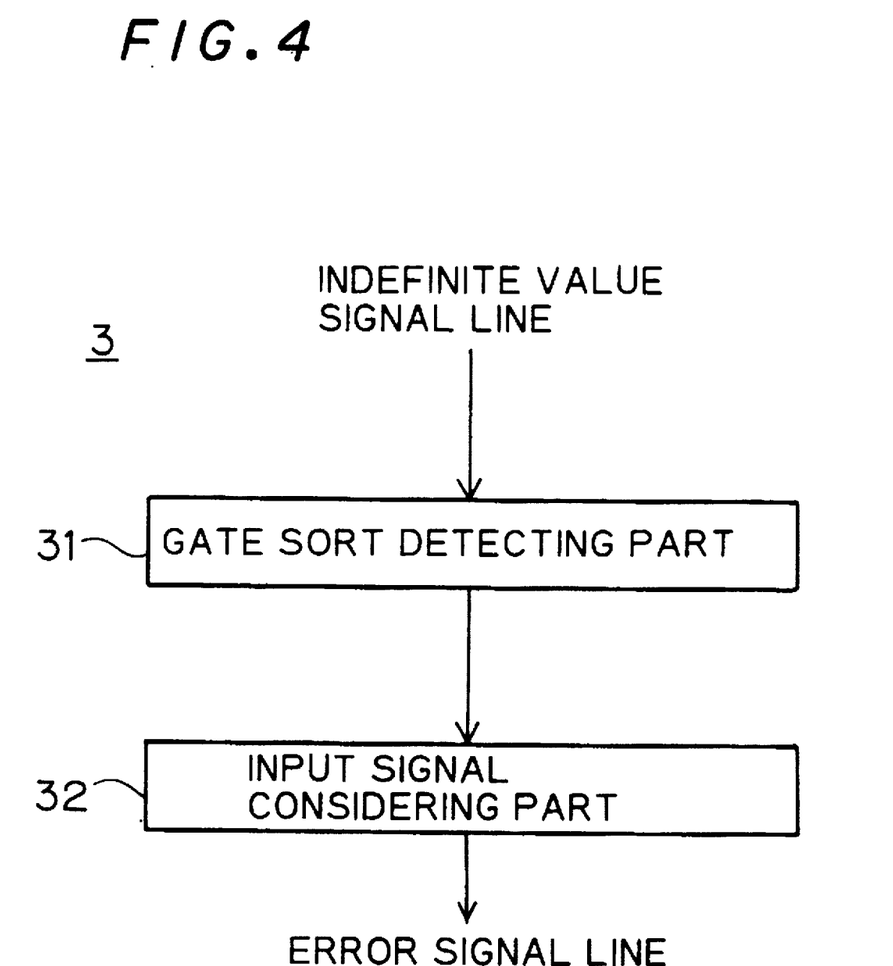
FIG. 4 is a block diagram showing a propagation deciding part 3 in detail.

FIG. 4 is a block diagram showing an internal structure of the propagation deciding part 3. The propagation deciding part 3 has a gate sort detecting part 31 and an input signal considering part 32.

Figure 5:
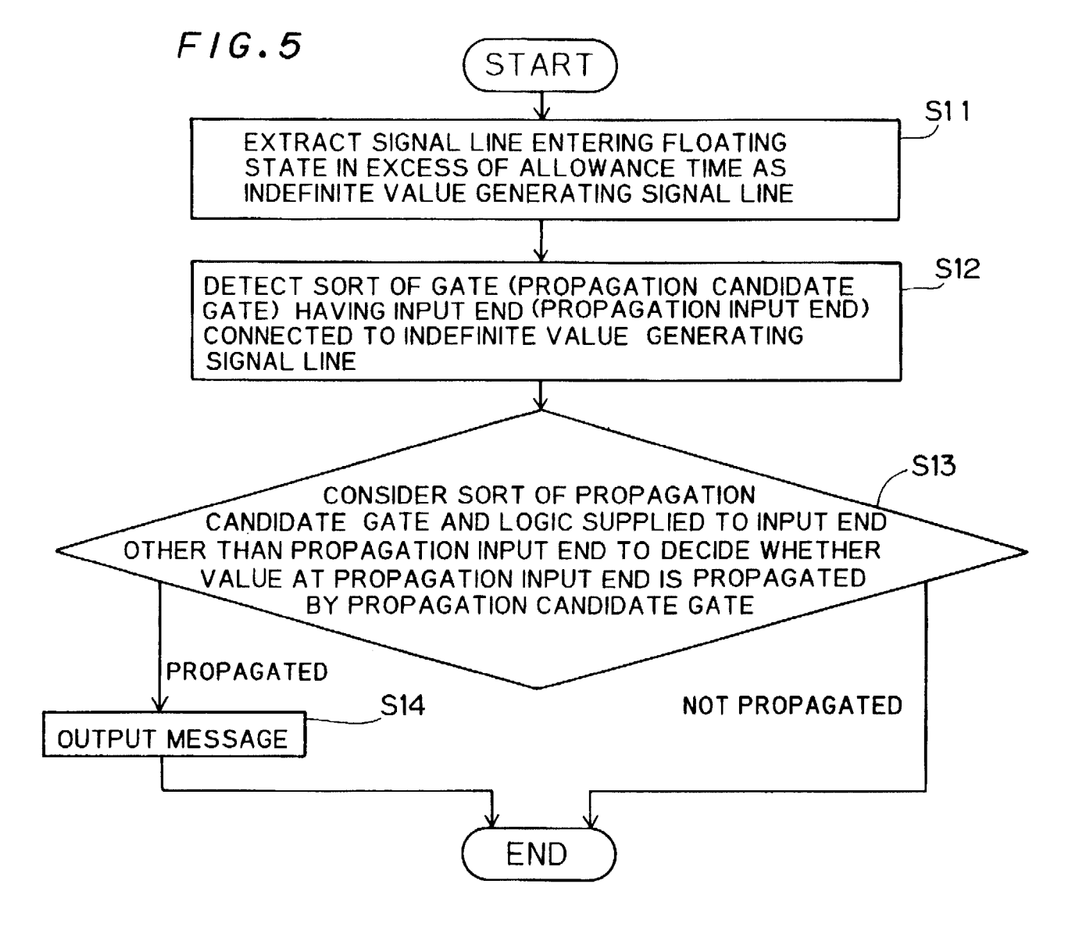
FIG. 5 is a flow chart for illustrating the embodiment 1 of the present invention.

The operation is now described. FIG. 5 is a flow chart for illustrating a principal operation of the logic simulation executing part 100 according to this embodiment. On the basis of this flow chart, the operation is now made with reference to the logic circuit shown in FIG. 2.

When the logic simulation executing part 100 executes logic simulation on the circuit connection data of the logic circuit on the basis of the input signal data, the indefinite value generating signal line extracting part 2 sequentially observes signal values on signal lines provided in the logic circuit, to extract a signal line which is in a floating state in excess of a constant allowance time by a circuit operation as an indefinite value generating signal line (step S11).

Assuming that the transfer gate 5 is turned off by a signal supplied to the gate electrodes of the transistors 6 and 7 in the logic circuit shown in FIG. 2, for example, the signal line 10 enters a floating gate. If the OFF state of the transfer gate 5 is maintained in excess of a prescribed allowance time, therefore, the signal line 10 is extracted as an indefinite value generating signal line. This is because electric charges on the signal line 10 may leak to a substrate or the like to instabilize its potential when the logic circuit is formed in practice. The allowance time can be arbitrarily set in the logic simulation system.

The gate sort detecting part 31 forming the propagation deciding part 3 detects the sort of a propagation candidate gate having a propagation input end (step S12). This can be readily executed through the circuit connection data. Further, the input signal considering part 32 decides whether or not the propagation candidate gate propagates the value (indefinite value) received in the propagation input end, in consideration of the sort of the propagation candidate gate and a value which is supplied to an input end thereof other than the propagation input end (step S13).

Figure 6:
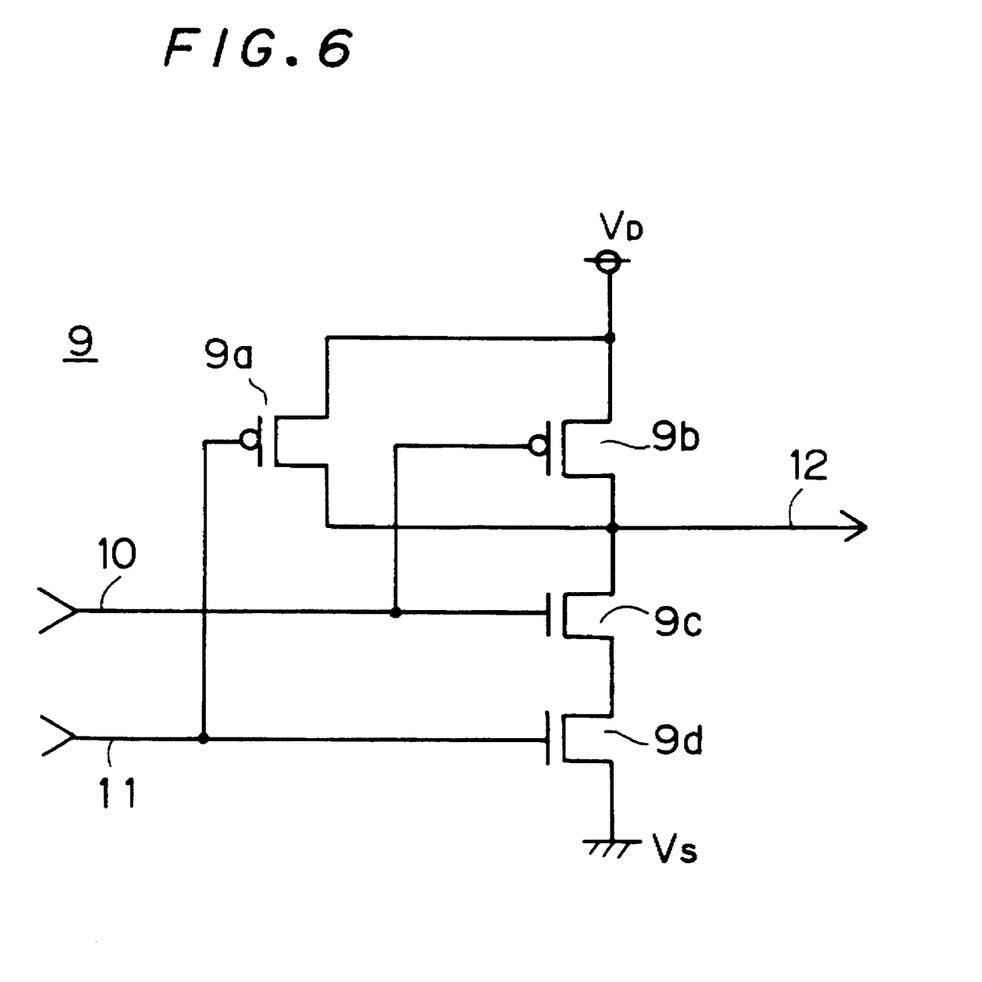
FIGS. 6 to 8 are circuit diagrams for illustrating the embodiment 1 of the present invention.

The reason why the aforementioned steps S12 and S13 are executed is now described. FIG. 6 is a circuit diagram showing the structure of the NAND gate 9. The NAND gate 9 comprises PMOS transistors 9a and 9b having source electrodes which are connected to a high potential $V_D$, an NMOS transistor 9d having a source electrode which is connected to a low potential $V_S$, and an NMOS transistor 9c having a source electrode which is connected to a drain electrode of the NMOS transistor 9d. The drain electrodes of the transistors 9a, 9b and 9c are connected in common, to serve as an output end of the NAND gate 9 which is connected with the signal line 12. Gate electrodes of the transistors 9b and 9c are connected in common to the signal line 10 to serve as one input end of the NAND gate 9, while gate electrodes of the transistors 9a and 9d are connected to the signal line 11 to serve as the other input end of the NAND gate 9.

The signal line 10 is supplied with an indefinite value, and it is not ascertained whether the transistors 9b and 9c are in ON or OFF states. If the transistor 9d enters an ON state, therefore, a through current may flow to the transistors 9b and 9c. Namely, the indefinite value of the signal line 10 may be propagated to the signal line 12 to feed a through current if the signal line 11 is at a high level.

If the signal line 11 is at a low level, on the other hand, the transistor 9d enters an OFF state and hence the indefinite value of the signal line 10 is not propagated to the signal line 12. In this case, there is no such possibility that a through current flows to the transistors 9b and 9c since the transistor 9d disconnects a current path.

Thus, it is possible to correctly decide whether or not a through current flows to a propagation candidate gate, i.e., whether or not an indefinite value is propagated, by considering a signal which is supplied to an input end other than a propagation input end. The step S13 is provided for this purpose. However, it is necessary to detect the sort of the propagation candidate gate at the step S12, since consideration of the input end signal depends on the sort of the propagation candidate gate.

Table 1 shows conditions for consideration of the input end signal depending on the sorts of propagation candidate gates in concrete terms. While Table 1 shows conditions as to whether or not indefinite signal values are propagated, these conditions also apply to whether or not through currents flow.

TABLE 1

| | |
|---|---|
| Logic NOT Gate (NOT) Exclusive Logic gate (EXOR, EXNOR) | The indefinite value is regularly propagated. |
| AND Gate (AND, NAND) | The indefinite value is not propagated when a logic value "L" is inputted in at least one of input ends other than the propagation input end (Condition C1). |
| OR Gate (OR, NOR) | The indefinite value is not propagated when a logic value "H" is inputted at least in one of input ends other than the propagation input end (Condition C2). |
| Switch Gate (NMOS, PMOS, CMOS) | (1) The indefinite value is not propagated when the propagation input end is connected to the control terminal (gate electrode) and logic values of the source and drain electrodes are currently equal to each other (Condition 3). (2) The indefinite value is not propagated when the propagation input end is connected to the source electrode and a logic value ("L" for NMOS or "H" for PMOS) for turning off the switch gate is currently inputted in the control terminal (Condition 4). |

A NOT gate having only one input end is provided with no input end other than a propagation input end. Thus, it necessarily propagates the indefinite value.

Figure 7:
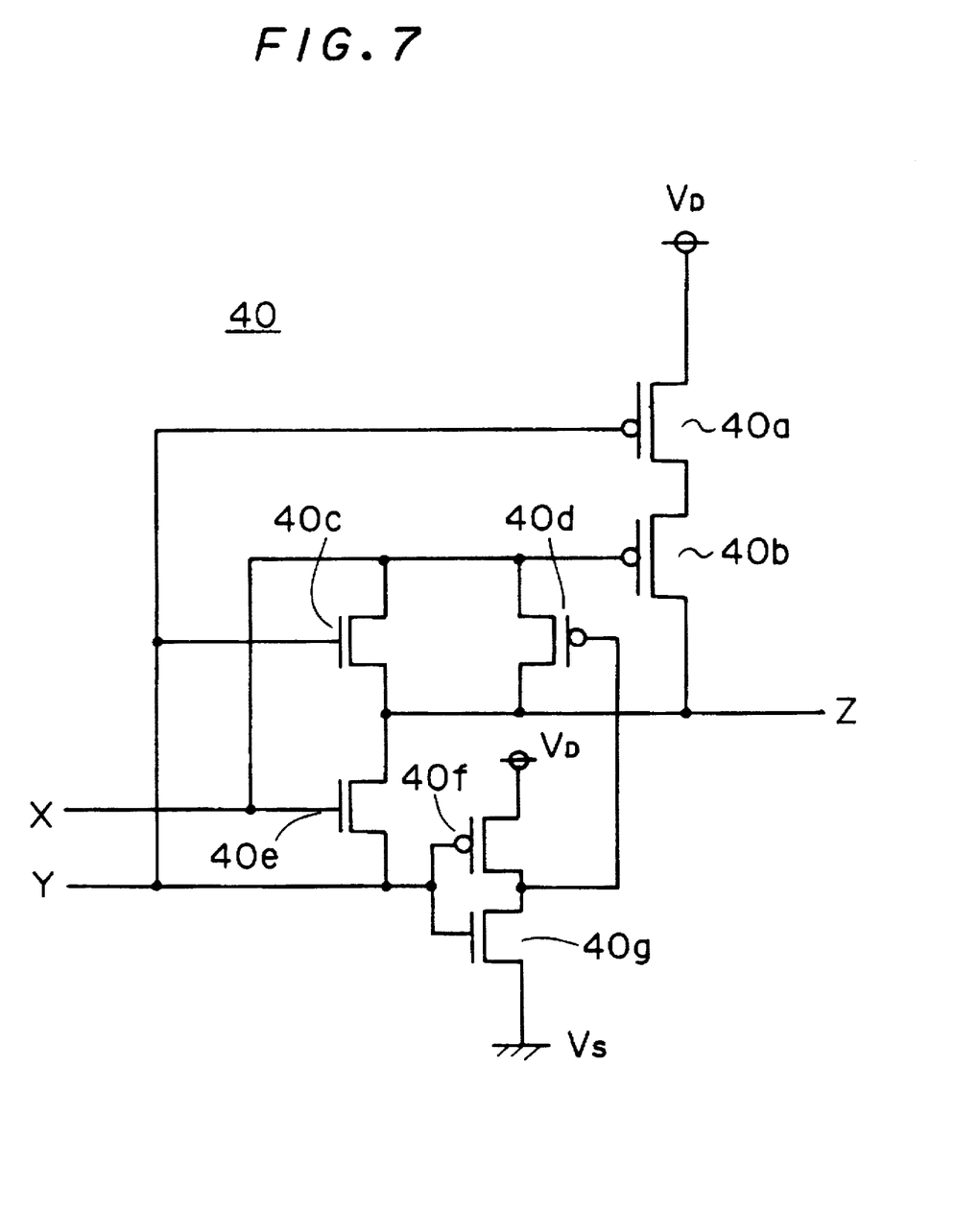

An EXNOR gate also necessarily propagates the indefinite value. FIG. 7 is a circuit diagram showing the structure of an EXNOR gate 40. NOT of exclusive OR of two input signals X and Y is obtained as an output signal Z. Consider that the input signal X has an indefinite value and the input signal Y is at a high level. A PMOS transistor 40d is turned on since an NMOS transistor 40g enters an ON state. Thus, the value of the input signal X is transmitted as the output signal Z. Since a transistor 40c is also in an ON state at this time, a transistor 40e is supplied in its source electrode with the input signal X. On the other hand, it is not yet ascertained whether the transistor 40e which is also supplied with the input signal X in its gate electrode is in an ON or OFF state. Since the transistor 40g is in an ON state, a through current which is defined by the input signal X and the potential $V_S$ finally flows to the transistor 40e.

When the input signal Y is at a low level, on the other hand, a transistor 40a is turned on and states of transistors 40b and 40e which are supplied with the input signal X in gate electrodes thereof are not ascertained, whereby a through current which is defined by a potential corresponding to the logic "L" of the input signal Y and the potential $V_D$ flows to the transistors 40b and 40e.

When the input signal Y is provided with an indefinite value to the contrary, a through current flows to an inverter which is formed by the transistors 40f and 40g.

When one input end of an EXNOR gate corresponds to a transmission input end, the EXNOR gate propagates the indefinite value and feeds a through current regardless of a value which is supplied to another input end. This also applies to an EXOR gate.

The indefinite value is not propagated when the condition C1 is satisfied, as already described with reference to FIG. 6. This also applies to an AND gate.

Figure 8:
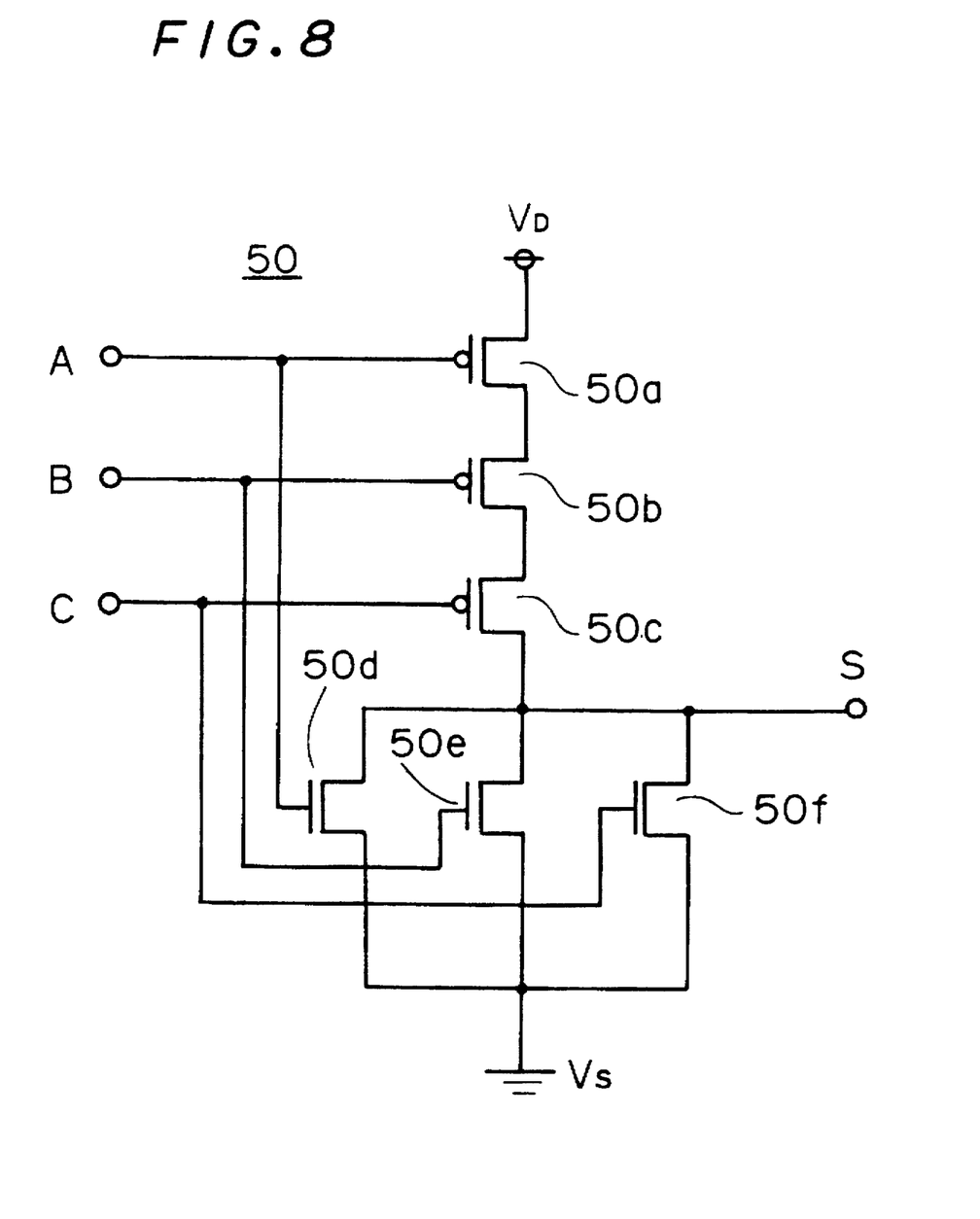

The indefinite value is not propagated when the condition C2 is satisfied. FIG. 8 is a circuit diagram showing the structure of a three-input OR gate 50. Even if any one of input signals A, B and C is at an indefinite value, the indefinite value is not propagated to an output signal S when at least any one of other input signals is at a high level. This is because at least one of PMOS transistors 50a, 50b and 50c which are connected in series with each other enters an OFF state and at least one of NMOS transistors 50d, 50e and 50f which are connected in parallel with each other enters an ON state to bring the output signal S into a low level. At this time, no through current flows either.

Further, the indefinite value is not propagated if either the condition C3 or C4 is satisfied. This is because logics which are supplied to source and drain electrodes are identically ascertained regardless of a switch state when the condition C3 is satisfied and hence no current flows, while the switch is in an OFF state when the condition C4 is satisfied and no current flows either.

Figure 9:
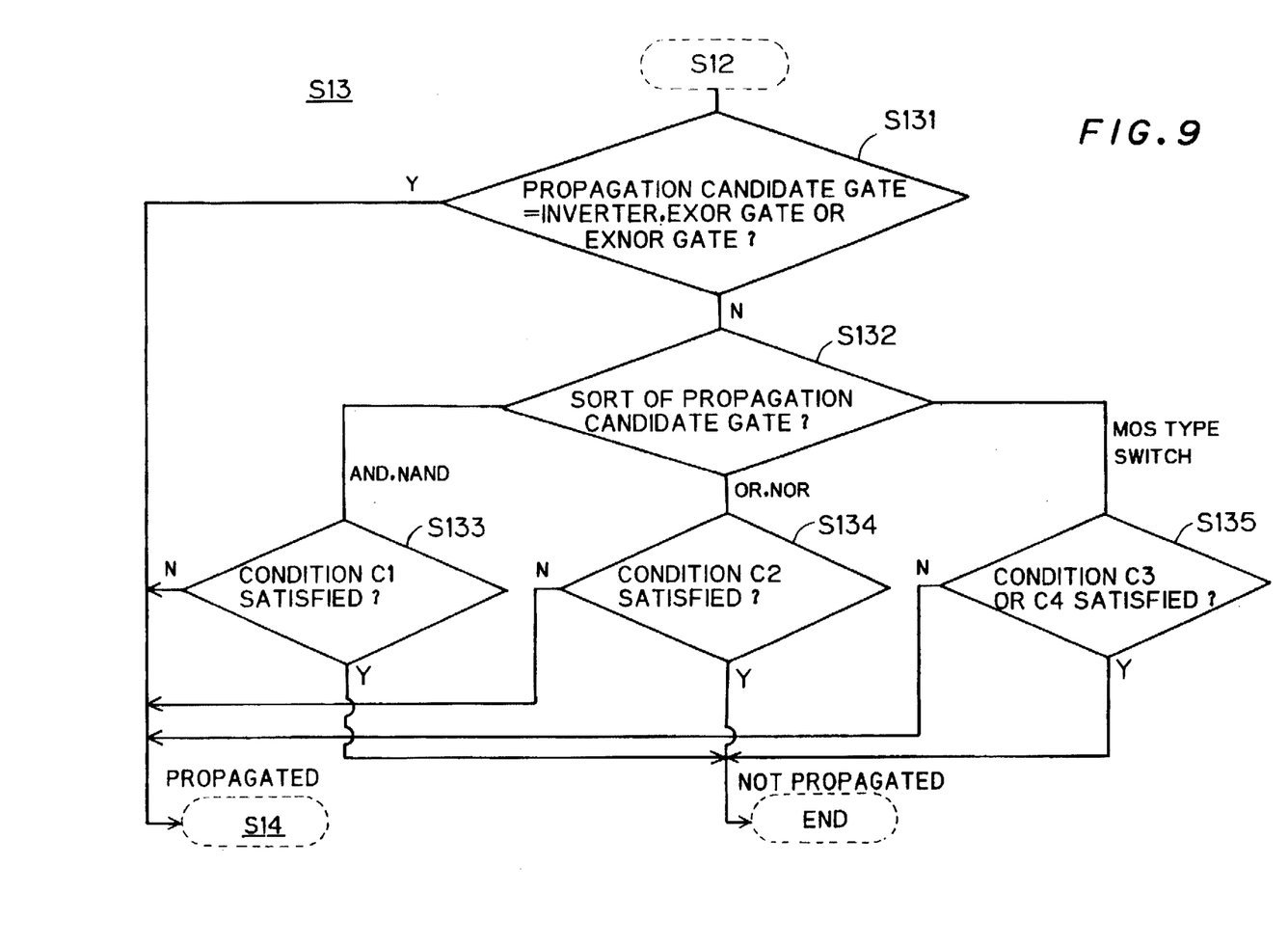
FIG. 9 is a flow chart showing a step S13 in detail.

FIG. 9 is a flow chart showing the step S13 in detail. The process is branched at a step S131 depending on the sort of the propagation candidate gate detected at the step S12. If the propagation candidate gate is any one of a NOT gate (inverter), an EXOR gate and an EXNOR gate, the process advances to the step S14. If the decision at the step S112 is of no, the process advances to a step S132, to be further branched depending on the sort of the propagation candidate gate. The process advances to a step S133, S134 or S135 if the propagation candidate gate is an AND or NAND gate, an OR or NOR gate, or a MOS switch.

If the condition C1, C2, or C3 or C4 is satisfied at the step S133, S134 or S135, a decision is made that the indefinite value is not propagated. In other cases, a decision is made that the indefinite value is propagated, and the process advances to the step S14.

As hereinabove described, no error signal line is detected if the propagation candidate gate corresponds to any one of the conditions since the value (indefinite value) at the propagation input end is not propagated. If the propagation candidate gate satisfies no condition or the same is a NOT, EXOR or EXNOR gate, on the other hand, the indefinite value is decided to be propagated and the indefinite value generating signal line is decided as an error signal line. In this case, a message is outputted at the step S14.

Referring again to FIG. 2, the sort of the gate 9 having the propagation input end which is connected with the signal line 10, being an indefinite value generating signal line, is decided. The gate 9 is a NAND gate. Then the signal which is supplied to the input end other than the propagation input end is considered. The value on the signal line 11 is considered in this case. If the value supplied to the signal line 11 is at a low level, the signal line 10 is not decided as an error signal line since the condition C1 is satisfied. If the value supplied to the signal line 11 is at a high level, on the other hand, the signal line 10 is decided as an error signal line since the condition C1 is not satisfied, and a warning message is outputted.

Namely, if a next stage gate is in a state of propagating the indefinite value to the output terminal as the result of decision at the step S13, the message output part 4 outputs a warning message to a CRT screen or an error list on the assumption that the indefinite value generated by the operation of the circuit may be propagated to feed a through current.

While a signal line which maintains a floating state in excess of a constant allowance time is extracted as an indefinite value generating signal line according to this embodiment, a signal line causing a collision of logic states may alternatively be extracted, as a matter of course.

Embodiment 2

Figure 10:
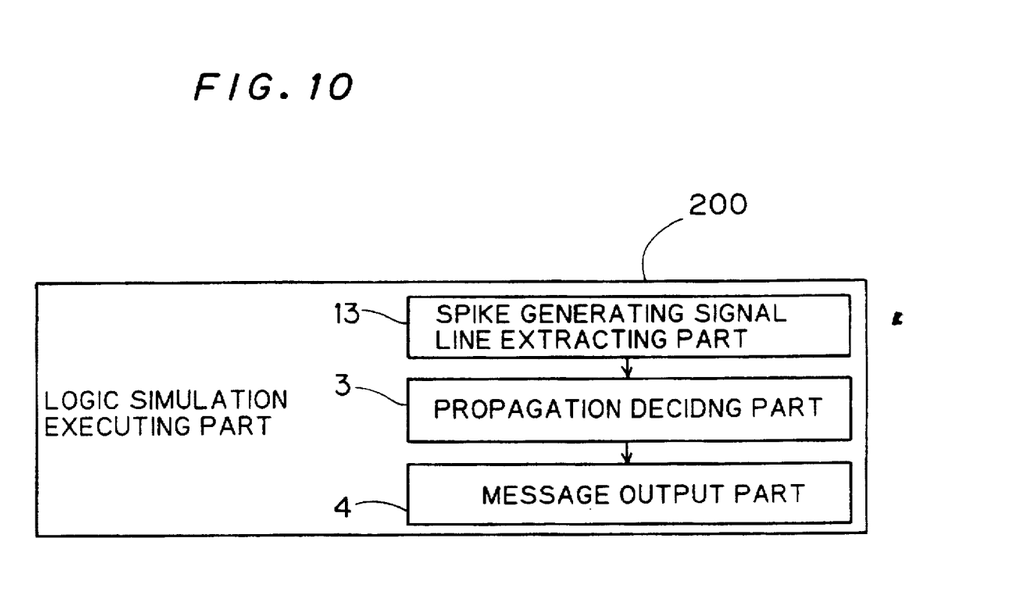
FIG. 10 is a block diagram showing an embodiment 2 according to the present invention.

FIG. 10 is a block diagram showing a logic simulation system according to another embodiment of the present invention. In a logic simulation executing part 200 according to this embodiment, the indefinite value generating signal line extracting part 2 of the logic simulation executing part 100 is replaced by a spike generating signal line extracting part 13.

The spike generating signal line extracting part 13 extracts a signal line, which is provided in a logic circuit, causing a spike signal value state by a circuit operation in execution of logic simulation.

A propagation deciding part 3 and a message output part 4 have functions which are similar to those of the logic simulation executing part 100.

Figure 11:
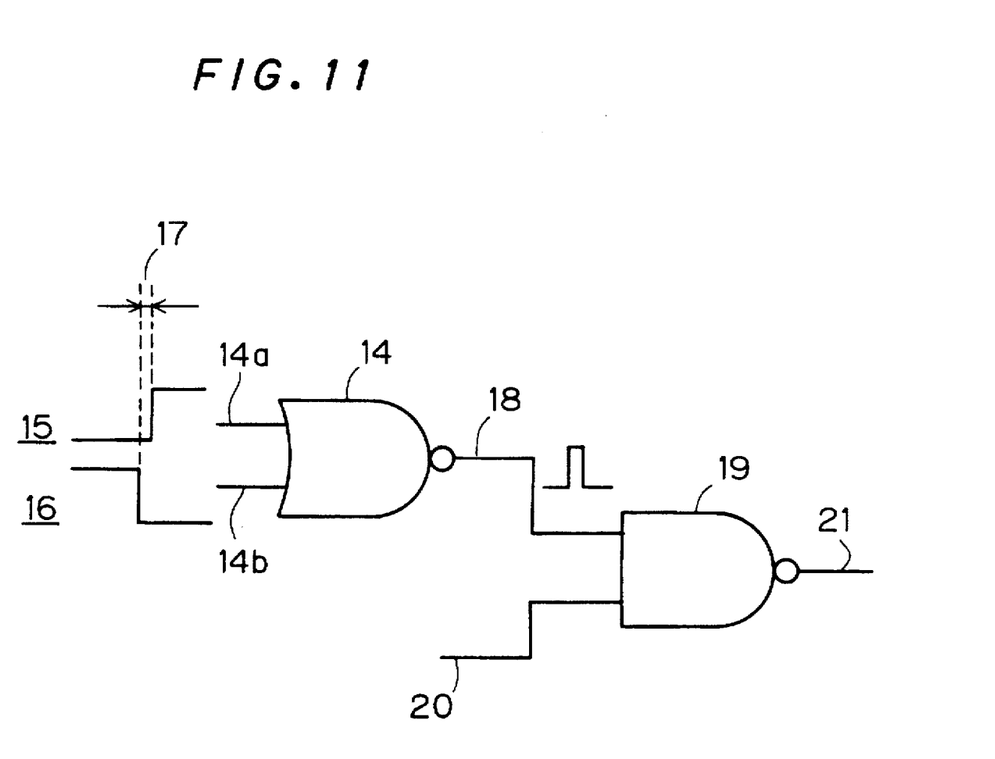
FIG. 11 is a circuit diagram illustrating a part of a logic circuit to be logically simulated.

The operation of the logic simulation executing part 200 is now described. FIG. 11 is a circuit diagram showing a part of a logic circuit to be logically simulated. A NOR gate 14 has two input ends which are connected with two signal lines 14a and 14b, and an output end which is connected with a signal line 18. A NAND gate 19 has input ends which are connected with signal lines 18 and 20 respectively, and an output end which is connected with a signal line 21.

The signal lines 14a and 14b receive signals 15 and 16 respectively. Leading and trailing edges of the signals 15 and 16 form a hazard generation time 17. Thus, a spike is generated on the signal line 18.

The operation is now described. Similarly to the logic simulation executing part 100, the logic simulation executing part 200 is supplied with circuit connection data shown in FIG. 11 and input signal data inputted therein, to execute logic simulation on the basis thereof. At this time, the spike generating signal line extracting part 13 sequentially observes signal values on signal lines which are provided in the logic circuit, to extract a signal line carrying a spike signal having a width of less than a constant time. Due to the circuit operation, a gate receiving two signals such as the signals 15 and 16 forming the hazard generation time 17 supplies a spike signal to the signal line 18, whereby the signal line 18 is extracted as a spike generating signal line.

The propagation deciding part 3 decides whether or not a next stage gate which is connected to the spike generating signal line propagates the spike signal. Similarly to the embodiment 1, this decision is made in consideration of a value which is supplied to an input end of the next stage gate other than that connected with the spike generating signal line. Referring to FIG. 11, a decision is made as to whether or not the NAND gate 19 propagates the spike signal depending on the level of the value which is supplied to the input end of the NAND gate 19 not connected with the signal line 18, i.e., the value supplied to the signal line 20, at the simulation time generating the spike signal value on the signal line 18.

The decision is made in a manner absolutely identical to that shown in Table 1. Referring to Table 1, "indefinite value" may be replaced by "spike signal". When the conditions C1 to C4 are satisfied, the spike signal is not propagated to an output end of a gate having the input end receiving the same. Thus, there is no possibility that an unnecessary current instantaneously flows in the gate, and hence no unnecessary power is consumed. Further, the next stage is not erroneously driven and no racing is caused.

Similarly to the embodiment 1, the message output part 4 outputs a warning message as to an error signal line to a CRT screen or an error list when the next stage gate which is connected to the spike generating signal line propagates the spike signal value to its output terminal.

While the invention has been shown and described in detail, the foregoing description is in all aspects illustrative and not restrictive. It is therefore understood that numerous modifications and variations can be devised without departing from the scope of the invention.

What is claimed is:

1. A logic simulator for carrying out logic simulation by receiving:
    circuit connection data of a logic circuit to be logically simulated, having a plurality of logic elements, and
    input signal data corresponding to input signals being supplied to said logic circuit,
    said logic simulator comprising:
        (a) error signal line candidate extracting means for extracting an indefinite value generating signal line as an error signal line candidate on the basis of said circuit connection data and said input signal data;
        (b) a logic element type detecting part for detecting the type of a propagation logic element, being one of said logic elements, which includes a first propagation input end connected with said error signal line candidate;
        (c) a processing part for determining if said error signal line candidate is an error signal line in accordance with predetermined conditions including said detected type of the propagation logic element, and when said propagation logic element further includes a second propagation input end, said predetermined conditions further including a value of a signal input to said second propagation input end; and
        (d) an output part for displaying said error signal line;
    wherein said error signal line candidate extracting means extracts a signal line maintaining a floating state in excess of a predetermined allowance time as said error signal line candidate.

2. A logic simulator for carrying out logic simulation by receiving:
    circuit connection data of a logic circuit to be logically simulated, having a plurality of logic elements, and
    input signal data corresponding to input signals being supplied to said logic circuit,
    said logic simulator comprising:
        (a) error signal line candidate extracting means for extracting an indefinite value generating signal line as an error signal line candidate on the basis of said circuit connection data and said input signal data;
        (b) a logic element type detecting part for detecting the type of a propagation logic element, being one of said logic elements, which includes a first propagation input end connected with said error signal line candidate;
        (c) a processing part for determining if said error signal line candidate is an error signal line in accordance with predetermined conditions including said detected type of the propagation logic element, and when said propagation logic element further includes a second propagation input end, said predetermined conditions further including a value of a signal input to said second propagation input end; and
        (d) an output part for displaying said error signal line;
    wherein said error signal line candidate extracting means extracts a signal line generating a spike signal as said error signal line candidate.

3. A logic simulator for carrying out logic simulation by receiving:
    circuit connection data of a logic circuit to be logically simulated, having a plurality of logic elements, and
    input signal data corresponding to input signals being supplied to said logic circuit, said logic simulator comprising:
- (a) error signal line candidate extracting means for extracting an indefinite value generating signal line as an error signal line candidate on the basis of said circuit connection data and said input signal data;
- (b) a logic element type detecting part for detecting the type of a propagation logic element, being one of said logic elements, which includes a first propagation input end connected with said error signal line candidate;
- (c) a processing part for determining if said error signal line candidate is an error signal line in accordance with predetermined conditions including said detected type of the propagation logic element, and when said propagation logic element further includes a second propagation input end, said predetermined conditions further including a value of a signal input to said second propagation input end; and
- (d) an output part for displaying said error signal line;

wherein said processing part decides said error signal line candidate connected to said first propagation input end as said error signal line when said propagation logic element is a NOT gate.

4. A logic simulator in accordance with claim 3, wherein said predetermined conditions further comprise the following condition:
- (c-1) said error signal line candidate connected to said first propagation input end is determined as said error signal line when said propagation logic element is either an EXOR gate or an EXNOR gate.

5. A logic simulator in accordance with claim 4, wherein said predetermined conditions further comprise the following condition:
- (c-2) said error signal line candidate is not determined as said error signal line when said propagation logic element is either an AND gate or a NAND gate and said second propagation input end receives a logic "L" signal.

6. A logic simulator in accordance with claim 5, wherein said predetermined conditions further comprise the following condition:
- (c-3) said error signal line candidate is not determined as said error signal line when said propagation logic element is either an OR gate or a NOR gate and said second propagation input end receives a logic "H" signal.

7. A logic simulator in accordance with claim 6, wherein said predetermined conditions further comprise the following condition:
- (c-4) said error signal line candidate is not determined as said error signal line when said propagation logic element is a switch gate element including first and second electrodes and a control electrode, said first and second electrodes being on-off controlled by a logic value being supplied to said control electrode, and logic values of said first and second electrodes are equal to each other at such a point of time that said control electrode corresponds to said first propagation input end.

8. A logic simulator in accordance with claim 7, wherein said predetermined conditions further comprise the following condition:
- (c-5) said error signal line candidate is not determined as said error signal line when said propagation logic element is said switch gate element and a logic value for turning off said switch gate is inputted in said control electrode at such a point of time that said first electrode corresponds to said first propagation input end.

9. A logic simulation method for carrying out logic simulation in a logic simulator by obtaining:
- circuit connection data of a logic circuit to be logically simulated, having a plurality of logic elements, and
- input signal data corresponding to input signals being supplied to said logic circuit, said logic simulation method comprising:
- (a) a step of extracting an indefinite value generating signal line as an error signal line candidate on the basis of said circuit connection data and said input signal data;
- (b) a step of detecting the type of a propagation logic element, being one of said logic elements, which includes a first propagation input end connected with said error signal line candidate;
- (c) a step of determining if said error signal line candidate is an error signal line in accordance with predetermined conditions including said detected type of the propagation logic element, and when said propagation logic element further includes a second input end, said predetermined conditions further including a value of a signal input to said second propagation input end; and
- (d) a step of displaying said error signal line;

wherein a signal line maintaining a floating state in excess of a predetermined allowance time is extracted as said error signal line candidate in said step (c).

10. A logic simulation method for carrying out logic simulation in a logic simulator by obtaining:
- circuit connection data of a logic circuit to be logically simulated, having a plurality of logic elements, and
- input signal data corresponding to input signals being supplied to said logic circuit, said logic simulation method comprising:
- (a) a step of extracting an indefinite value generating signal line as an error signal line candidate on the basis of said circuit connection data and said input signal data;
- (b) a step of detecting the type of a propagation logic element, being one of said logic elements, which includes a first propagation input end connected with said error signal line candidate;
- (c) a step of determining if said error signal line candidate is an error signal line in accordance with predetermined conditions including said detected type of the propagation logic element, and when said propagation logic element further includes a second input end, said predetermined conditions further including a value of a signal input to said second propagation input end; and
- (d) a step of displaying said error signal line;

wherein a signal line generating a spike signal is extracted as said error signal line candidate in said step (c).

11. A logic simulation method for carrying out logic simulation in a logic simulator by obtaining:
- circuit connection data of a logic circuit to be logically simulated, having a plurality of logic elements, and
- input signal data corresponding to input signals being supplied to said logic circuit, said logic simulation method comprising:
- (a) a step of extracting an indefinite value generating signal line as an error signal line candidate on the basis of said circuit connection data and said input signal data;

(b) a step of detecting the type of a propagation logic element, being one of said logic elements, which includes a first propagation input end connected with said error signal line candidate;

(c) a step of determining if said error signal line candidate is an error signal line in accordance with predetermined conditions including said detected type of the propagation logic element, and when said propagation logic element further includes a second input end, said predetermined conditions further including a value of a signal input to said second propagation input end; and (d) a step of displaying said error signal line;

wherein said error signal line candidate being connected to said first propagation input end is determined as said error signal line when said propagation logic element is a NOT gate in said step (c).

12. A logic simulation method in accordance with claim 11, wherein said predetermined conditions further comprise the following condition:

(c-1) said error signal line candidate connected to said first propagation input end is determined as said error signal line when said propagation logic element is either an EXOR gate or an EXNOR gate.

13. A logic simulation method in accordance with claim 12, wherein said, predetermined conditions further comprise the following condition:

(c-2) said error signal line candidate is not determined as said error signal line when said propagation logic element is either an AND gate or a NAND gate and said second propagation input and receives a logic "L" signal.

14. A logic simulation method in accordance with claim 13, wherein said predetermined conditions further comprise the following condition:

(c-3) said error signal line candidate is not determined as said error signal line when said propagation logic element is either an OR gate or a NOR gate and said second propagation input end receives a logic "H" signal.

15. A logic simulation method in accordance with claim 14, wherein said predetermined conditions further comprise the following condition:

(c-4) said error signal line candidate is not determined as said error signal line when said propagation logic element is a switch gate element including first and second electrodes and a control electrode, said first and second electrodes being on-off controlled by a logic value being supplied to said control electrode, and logic values of said first and second electrodes are equal to each other at such a point of time that said control electrode corresponds to said first propagation input end.

16. A logic simulation method in accordance with claim 15, wherein said predetermined conditions further comprise the following condition:

(c-5) said error signal line candidate is not decided as said error signal line when said propagation logic element is said switch gate element and a logic value for turning off said switch gate is inputted in said control electrode at such a point of time that said first electrode corresponds to said first propagation input end.

* * * * *